United States Patent [19]

Aksu

[11] Patent Number: 5,307,560
[45] Date of Patent: May 3, 1994

[54] AUTOMATED TEST PIN LOADING METHOD

[76] Inventor: Allen Aksu, 1044 Santiago Dr., Newport Beach, Calif. 92660

[21] Appl. No.: 922,569

[22] Filed: Jul. 30, 1992

[51] Int. Cl.$^5$ .................. H05K 13/04; G01R 1/073
[52] U.S. Cl. ........................ 29/842; 29/593
[58] Field of Search .............. 29/593, 739, 759, 760, 29/821, 834, 842, 720, 721, 844, 837; 221/168, 200; 29/720, 721, 884, 837; 324/158 F, 158 P

[56] References Cited

U.S. PATENT DOCUMENTS

| | | | |
|---|---|---|---|
| 3,765,075 | 10/1973 | Olney, Jr. et al. | 29/739 X |
| 4,736,522 | 4/1988 | Larson | 29/842 |
| 4,774,459 | 9/1988 | Maelzer et al. | 324/158 F |
| 4,825,538 | 5/1989 | Kubis | 29/842 X |

FOREIGN PATENT DOCUMENTS 3340184  5/1985  Fed. Rep. of Germany .

*Primary Examiner*—Peter Dungba Vo
*Attorney, Agent, or Firm*—Plante Strauss Vanderburgh

[57] ABSTRACT

There is disclosed a method, and apparatus useful in the method, for the automated loading of probes in a probe head intended for use in automated testing of printed circuit boards. The invention automatically places probes in a probe head at on-grid and at off-grid test points, with probes for the latter test points being vertically inclined from base ends which are on-grid to test ends which are off-grid, corresponding to the off-grid test points of the printed circuit board. In the method, the probes are stored in a dispensing unit which is fully populated with on grid probes at a uniform grid spacing. A mask is custom drilled for the circuit under test at on-grid locations and is used to permit transfer of selected probes from the dispensing unit to a probe cassette. The probe cassette is then transferred to a probe loading unit which is loaded with a stack of the probe plates intended for the probe head. The probe plates are independently raised and lowered following a procedure which transfers the probes from the probe cassette into the probe plates.

15 Claims, 7 Drawing Sheets

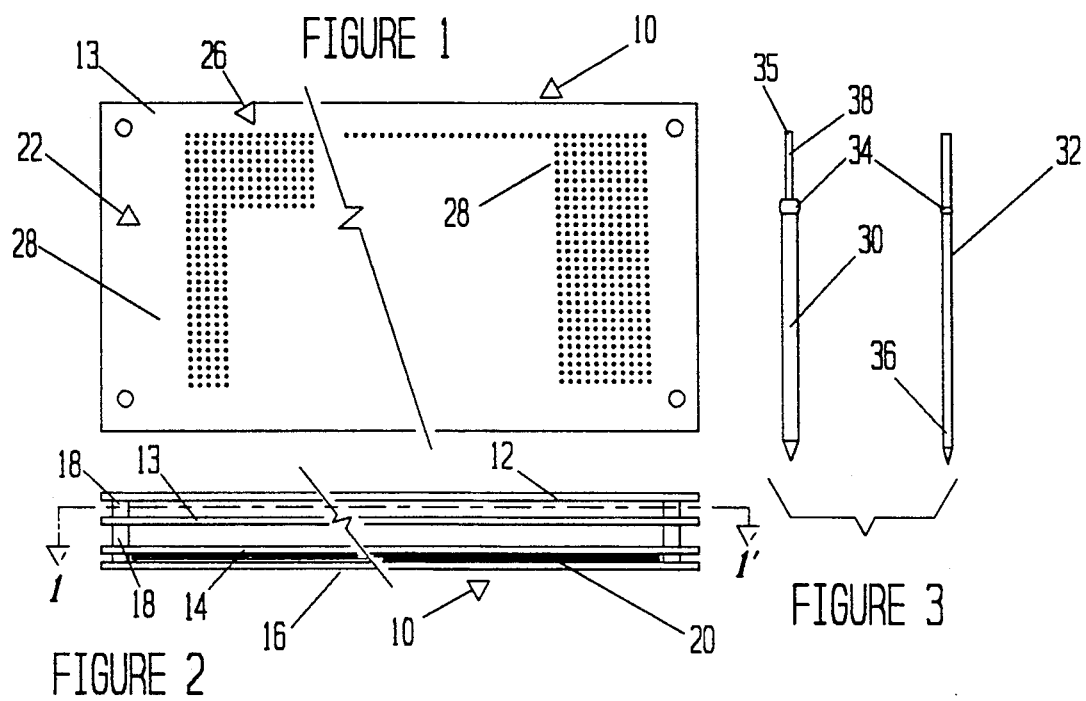
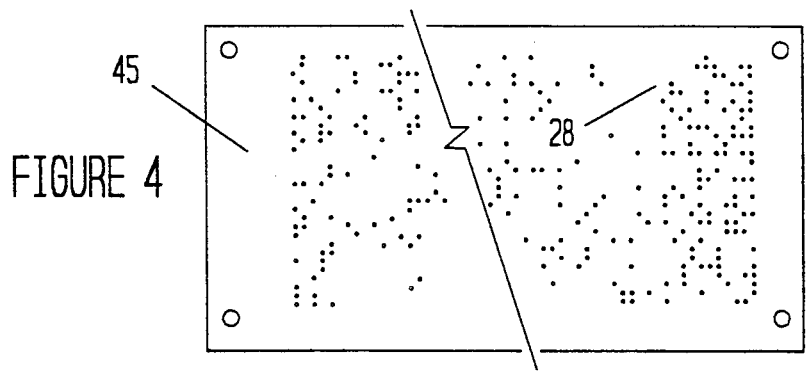
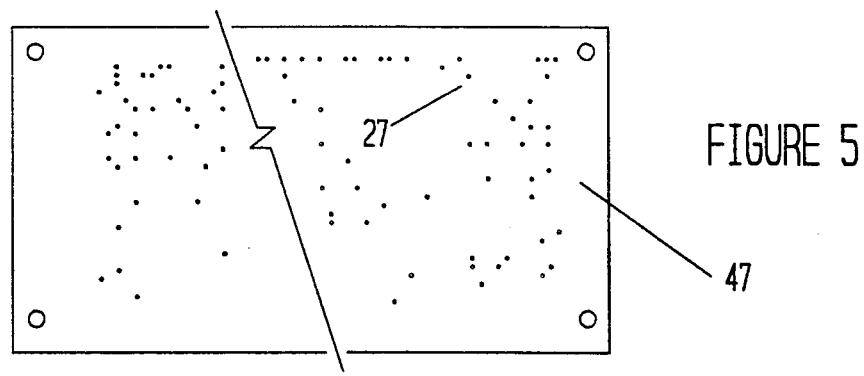

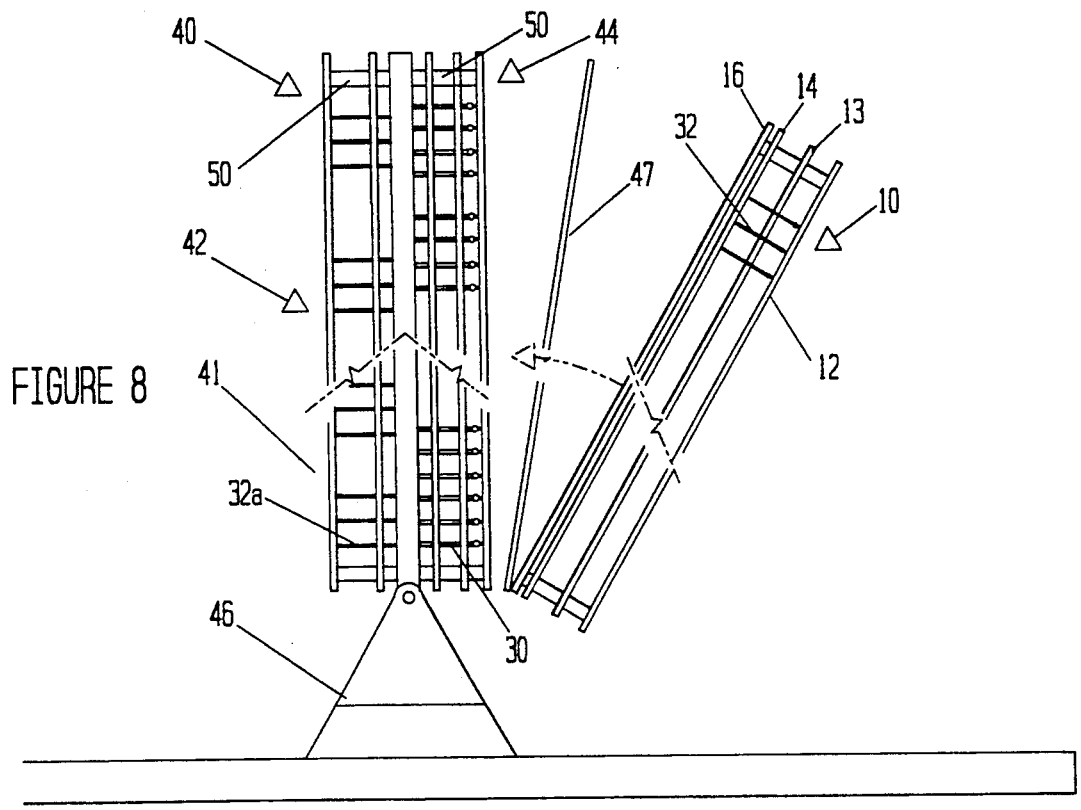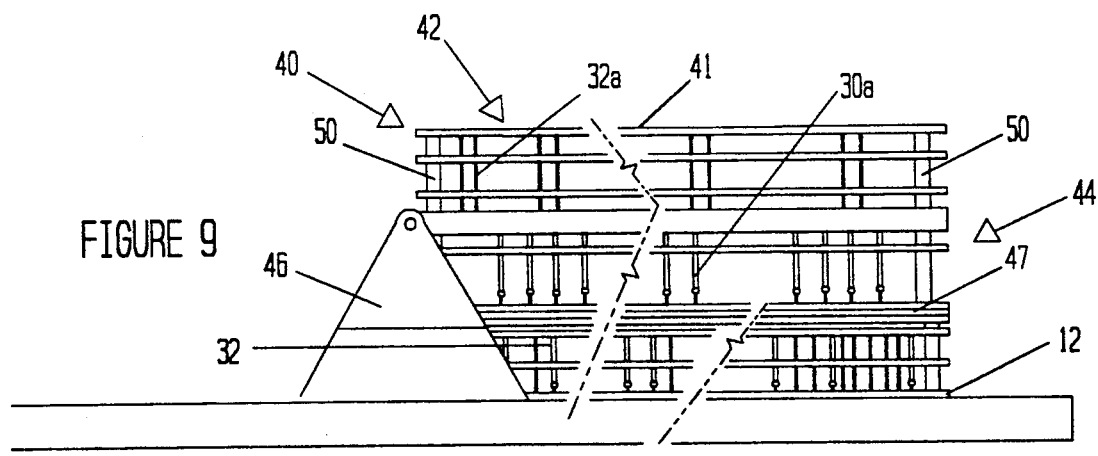

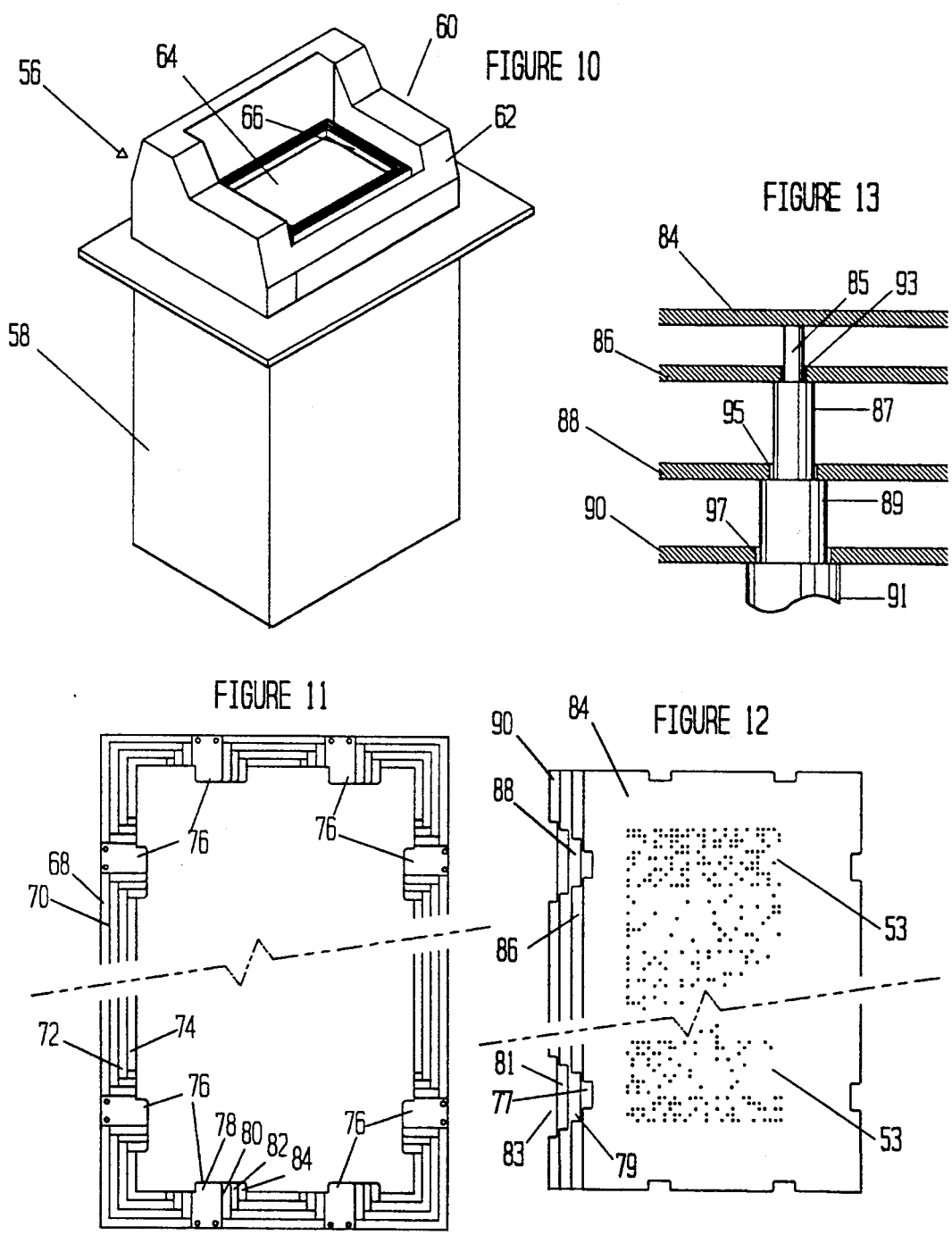

AUTOMATED TEST PIN LOADING METHOD

BACKGROUND OF THE INVENTION

1. Field of Invention

This invention relates to a method and apparatus for loading of test pins in a probe head (or adaptor) useful in automated testing of printed circuit boards and in particular to an automated probe loading method, and apparatus useful in that method.

2. Brief Statement of the Prior Art

The automated testing of printed circuit boards to detect manufacturing flaws and defects is commonly performed with a mechanical press with one or two test heads resting on the platens of the press. The test heads have many spring pins which are located at preselected points for testing of a printed circuit board with the most common pin-to-pin spacing being 0.1, 0.07 or 0.05 inch. The plates for the test heads are usually predrilled with a grid-like distribution of holes at the aforementioned uniform spacings.

Printed circuit board manufacturing capability, however, has advanced to very compact configurations, particularly with surface mounted components such as integrated circuits. These surface mounted components are mounted with connections which are at closer spacings than the 0.05 inch, pin-to-pin distances which are the closest that can be practically provided with a grid distribution of holes for test pins. Accordingly, there is an increasing demand for adapters which translate the geometrically uniform grid locations of spring test pins to off-grid locations. Probe heads, which comprise a plurality of thin wire probes are supported in a fixture formed of two or more insulating plates separated by spacers, have been used as adapters for this purpose.

A typical probe head comprises two or more insulating plates separated by spacers, usually at corner locations. The plate of the probe head which is placed on the test head of the tester has holes which are located "on-grid", i.e., at the geometrical regular spacings corresponding to the grid of the test head. The plate which will be adjacent the printed circuit board under test, has holes which are located at the precise test point locations of the circuit board under test, a number of which will be "off-grid", i.e., will not be at the precise location of a test pin in the test head. The probes, which are typically a straight length of stiff wire, e.g., piano wire, are manually loaded into the plates and, when the particular test point served by a probe is off-grid, the probe is canted at a slight angle to extend from the on-grid hole in the plate next to the test head to the off-grid hole in the probe plate which is next to the printed circuit board. Frequently one or more additional insulating plates are positioned at intermediate levels between the upper and lower plates of the probe head and holes for the probes are drilled to align with the holes in the upper and lower plates.

The task of manually loading many thousands of probes into a probe head is a tedious and costly operation. Each printed circuit has its own, unique pattern of test points, and a unique probe head must be provided for testing boards of each unique printed circuit. Often the printed circuit board carries printed circuits on both sides, and in such instances, two probe heads are required for double sided testing of those printed circuit boards. As a single probe head can contain as many as 10,000 probes, it is apparent that manual loading of the probes in probe heads is a very expensive and difficult task, and is a serious limitation on the automated testing of printed circuit boards.

Some manufacturers have attempted to automate the task of loading probes into probe heads. Shaker tables have been devised to load the probe heads automatically. The shaker tables have limited application however, as they cannot be used for the extremely closely spaced test point patterns such as experienced with surface mount components. In a conventional shaker table loading procedure, a probe head comprising two or more plates is placed on a shaker table, a plurality of probes are placed with their bottom ends resting on the top plate, and the entire assembly is vibrated to encourage the probes to seek holes in the plates and fall into their final positions.

Other manufacturers build pin loaders comprising an x, y positioning table and a pin inserting head. The x, y table moves each hole of the probe head beneath the pin inserting head which inserts a probe. This is a sequential operation which is very time consuming.

OBJECTIVES OF THE INVENTION

It is an objective of this invention to provide a method for automatic loading of probes in a probe head useful for automated testing of printed circuit boards.

It is an additional objective of this invention to provide a method and apparatus for storage of probes while not in use.

It is a further object of this invention to provide a method for assembly of a probe head which is practiced concurrently with loading of the probes in the probe head.

It is yet another objective of this invention to provide a probe cassette that is useful for selection and transfer of probes from a storage unit to a probe head under assembly.

It is the objective of this invention to provide a method and apparatus for the loading of probes and the assembly of a probe head to provide extremely closely spaced off-grid test point locations.

Other and related objectives will be apparent from the following description of the invention.

BRIEF STATEMENT OF THE INVENTION

This invention comprises a method, and apparatus useful in the method, for the automated loading of probes in a probe head intended for use in automated testing of printed circuit boards. The invention automatically places probes in a probe head at on-grid and at off-grid test points, with probes for the latter test points being vertically inclined from base ends which are on-grid to test ends which are off-grid corresponding to the off-grid test points of the printed circuit board. In the method, the probes are stored in a dispensing unit which is fully populated with on grid probes at on-grid locations. A mask is custom drilled for the circuit under test at on-grid locations and is used to permit transfer of selected probes from the dispensing unit to a probe cassette. The probe cassette is then transferred to a probe loading unit which is loaded with a stack of the probe plates intended for the probe head. The probe plates are independently raised and lowered following a procedure which transfers the probes from the probe cassette into the probe plates.

BRIEF DESCRIPTION OF THE DRAWINGS

The invention will be described with reference to the FIGURES of which:

FIGS. 1 and 2 illustrate the probe cassette useful in selection and transporting of probes in the invention.

FIG. 2 is a plan view of the probe cassette, and FIG. 1 is a view along line 1—1' of FIG. 2;.

FIG. 3 is an enlarged view of large and small diameter probes useful in the invention;

FIGS. 4 and 5 are plan views of probe masks used with the invention.

FIG. 8 illustrates the placement of the probe cassette against the large probe side of the probe storage unit preliminary to loading of large probes in the probe cassette.

FIG. 9 illustrates the step of loading the large diameter probes into the probe cassette.

FIG. 10 is a perspective view of the probe loading stand used in the invention.

FIG. 11 is a plan view of a plurality of nested frames of the probe loading stand which can selectively elevate the various plates of the probe head during the loading of the probes.

FIG. 12 is a view of a stack of plates for a probe head of this invention;

FIG. 13 illustrates a construction which is an alternative to the nested frames shown in FIG. 9;

DESCRIPTION OF PREFERRED EMBODIMENT

Figure 6:
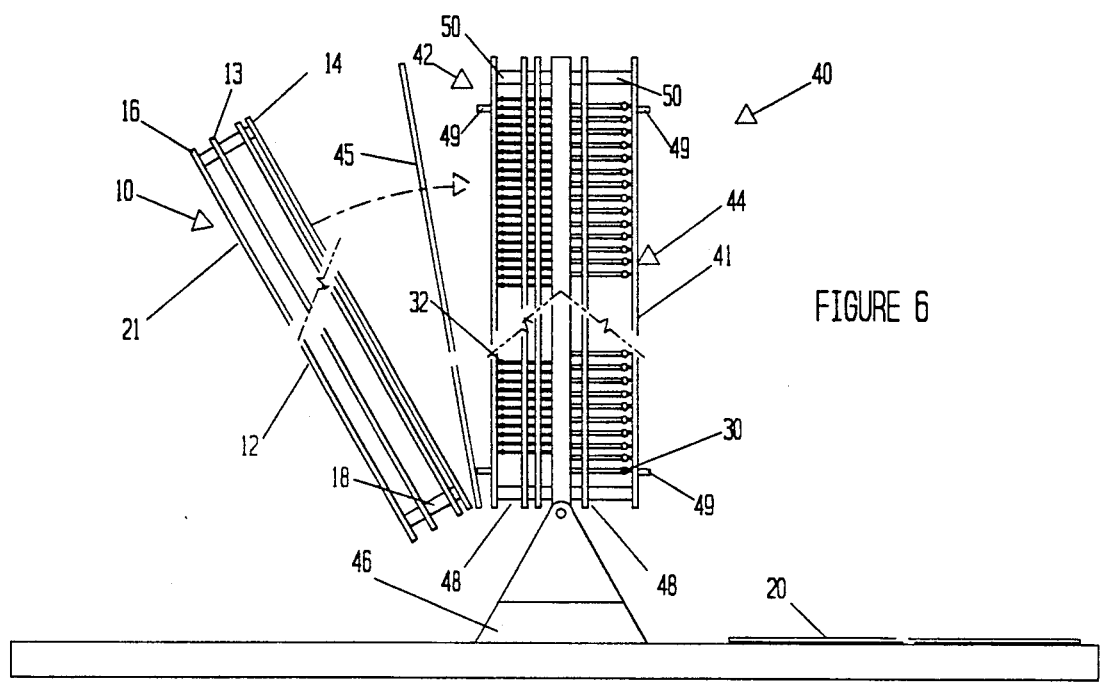
FIG. 6 is a side elevational view of a probe storage unit useful for storing and dispensing both the small and large diameter probes, and indicating the placement of the probe cassette onto the small probe side of the probe storage unit as a preliminary step in the loading of the probe head.

Referring now to FIGS. 1 and 2, the probe cassette 10 used in the invention has an upper plate 12 and three lower plates 13, 14 and 16 which are assembled in a spaced apart relationship by a plurality of spacers 18 which are located at each corner of the cassette 10. The two lowermost plates 14 and 16 are separated a slight distance and a shield plate 20 is slid into the space between plates 14 and 16. The plates 13, 14 and 16 are drilled with an on-grid pattern of large diameter holes 28 in a grid distribution of even spacings at a selected value, e.g., at 0.1 inch. Plate 12 is a blind, or undrilled plate. FIG. 1 shows only a portion of the holes 28 to avoid unnecessary complexity of the illustration.

Referring now to FIG. 3, the probes useful in the invention include a relatively large diameter probe 30, approximately 0.06 inch in diameter and a small diameter probe 32, approximately 0.02 inch in diameter. Each of the probes has a pointed test end, e.g., end 36 of probe 32. Preferably these probes have a bulbous enlargement 34 at a preselected intermediate location of their length, preferably at base ends 38 of the probes. This enlargement can be a crimp in the body of the probe which flattens the probe and expands its diameter in the plane of the crimp. The large diameter probes 30 preferably have a reduced diameter tail 35 beyond the bulbous enlargement 34. The diameter of the tail 35 of probes 30 is less than the diameter of the bulbous enlargement 34 of the small diameter probes 32.

Figure 7:
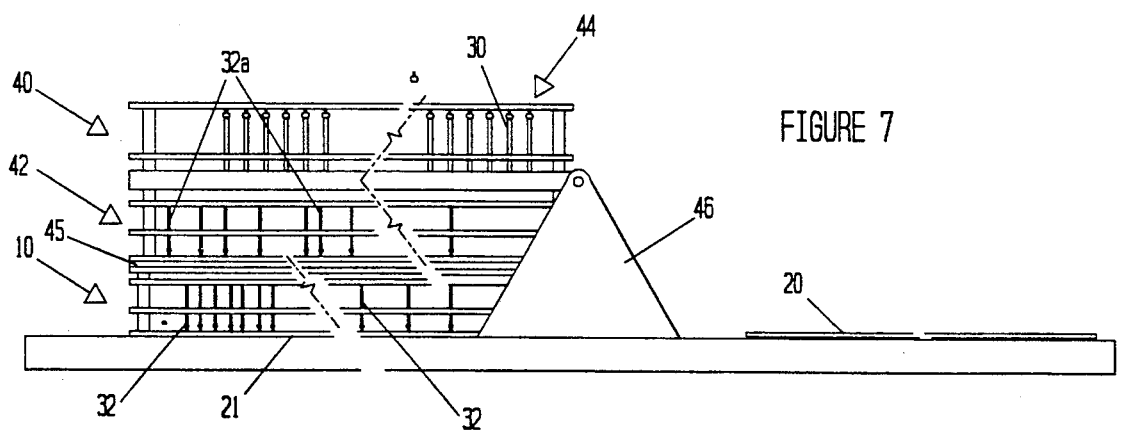
FIG. 7 illustrates the step of loading small diameter probes into the probe cassette from the storage unit.

FIGS. 4 and 5 are plan views of probe masks which are used in the invention, with the probe storage and dispensing unit, described hereafter with reference to FIGS. 7 through 9. The masks are thin plates which are drilled with patterns of holes at on-grid locations for selected test points of the printed circuit board which is to be tested. The masks are drilled with sufficiently large diameter holes to pass the bulbous enlargement 34 of the largest pin, and these holes are drilled at patterns unique to the circuit board which is to be tested. FIG. 4 illustrates the mask 45 which is used with holder 42 and is drilled with a unique pattern 28 of large diameter holes which are all at on-grid locations and which correspond in number and location to the test points on the printed circuit board which are to be accessed with small diameter probes 32. FIG. 5 illustrates mask 47 which is drilled with a unique pattern 27 of large diameter holes which are also all at on-grid locations and which correspond in number and location to the test points on the printed circuit board which are to be accessed by large diameter probes 30.

Referring now to FIG. 6, there is illustrated a probe storage and dispensing unit 40 in which the probes 30 and 32 are stored and dispensed for use in the invention. The storage and dispensing unit 40 comprises a first probe holder 42 and a second probe holder 44 which are assembled together with the assembly pivotally mounted on a stand 46. Each holder of the storage and dispensing unit 40 comprises a plurality of plates 48 which are retained in a spaced apart array by spacers 50 located at each corner of each holder.

A probe such as 30 and 32 is loaded in each hole of the uniform grid of the holders 42 and 44. Only a few probes are shown in the holders for ease of illustration. Briefly, however, each holder 42 and 44 of the storage and dispensing unit 40 is loaded with a plurality of probes; the holder 42 is loaded with the small diameter probes 32 and the holder 44 is loaded with the large diameter probes 30. The probes are loaded in each of the holders at maximum density corresponding to the grid pattern for each of these holders, typically on grid at 0.1 inch probe-to-probe spacing.

The storage and dispensing unit 40 is used by placing mask 45 against the outer plate of the probe holder 42. Each holder has a plurality of locator posts 49 which precisely orient the masks, and the probe cassette to the holders.

After the mask 45 has been placed against the holders 42, the probe cassette 10 is placed opposite the mask 45, against the holder 42 as illustrated by the broken arrowhead line in FIG. 4. The shield plate 20 is removed from the cassette 10 and is shown separate from the cassette, in the illustration. The holes drilled in the cassette plates 13, 14 and 16 are of sufficient diameter to pass the bulbous enlargements 34 (see FIG. 3) of the probes, and the plate 12 retains the probes in the cassette during handling and movement of the cassette.

The probe cassette 10 is indexed on locator posts 49 of the holder 42 and the probe cassette 10 and the storage and dispensing unit 40 are then pivoted to a horizontal position with the holder 42 resting over the probe cassette as shown in FIG. 7.

In the position shown in FIG. 7, the probes 32 which align with the holes which have been drilled in the mask 45 fall into aligned on-grid holes in the plates 13, 14 and 16 of the probe cassette 10, exiting the holder 42 of the storage and dispensing unit 40; see for example, probe 32. The probes which do not align with holes in the mask 45 remain in holder 42; see probes 32a.

The storage and dispensing unit 40 is then returned to its vertical position, the probe cassette 10 is removed and mask 47 is placed against the outer plate of the probe holder 44, and the probe cassette 10 is placed against the mask 47, as shown in FIG. 8. During this transfer, the shield plate 20 can be inserted to avoid any possibility of accidently discharging any probes from the cassette, which could occur if the cassette were inverted during handling.

Once the cassette has been placed against holder 44, the shield plate 20 is removed, and the entire assembly is pivoted into the horizontal position shown in FIG. 9 with the holder 44 resting above the probe cassette 10. In this position, the larger diameter probes 30, which align with holes in the mask 47 and the large diameter holes in the plates 13, 14 and 16 of the probe cassette 10 will fall into the cassette 10, exiting from the holder 44. The probes 30a which do not align with holes in the mask 47 will remain in the holder 44.

The plate 20 is then returned to the probe cassette, locking all the probes in the cassette between the blind plate 12 and the shield plate 20, thereby preventing accidental discharge of probes during handling of the cassette. The cassette is then transferred to the probe loading machine 56 which is illustrated in FIG. 10. This machine 56 has a base 58 with a top 60 and a hinged cover 62 surrounding a central open area 64 in which is supported a plurality of nested frames, generally identified as 66.

FIG. 11 illustrates the nested frames 66 as comprising a plurality of four frames 68, 70, 72 and 74, each of which has four brackets such as brackets 76, which are offset from frame to frame to provide abutment ledges such as 78, 80, 82 and 84 which mate with the probe plates which are notched so as to be selectively engaged by each of the brackets for a respective frame, whereby each plate is independently moveable by a respective frame.

FIG. 12 illustrates a stack of the probe plates 84, 86, 88 and 90. In the illustration, the probe plates are successively displaced slightly, left to right, so that the left edges of plates 86, 88 and 90 are visible. The top plate 84 is shown with the pattern 5 of both small and large diameter holes, all of which are on-grid, i.e., at locations coinciding with the centers of the grid, e.g., on 0.1 inch probe-to-probe spacings.

The probe plates all have identical overall exterior dimensions, and have varied widths of notches, with the uppermost plate 84 having the shortest notches 77, and each successive plate, 86, 88 and 90 having notches 79, 81 and 83 of increasing length. Those notches align with the brackets on the frames so that the uppermost bracket 76 clears all plates except the uppermost plate 84, and the successively lower brackets engage successively lower plates. In this manner, the plates are engaged by respective ledges 78, 80, 82 and 84 of the brackets and are separately raised or lowered by movement of the frames which support the brackets. The notches are symmetrical, while the brackets are not; this permits the plates to be loaded with probes and also to be inverted for unloading of the probes from the probe plates.

An alternative mechanism for independent lifting and lowering of the plates 84, 86, 88 and 90 is shown in FIG. 13. In this mechanism, a lift is formed with telescoping, coaxial cylindrical rods 85, 87, 89 and 91. These rods align with concentric holes 93, 95 and 97 in the plates 90, 88 and 86. As the holes are of successively increasing diameter, corresponding to the diameters of the rods, all rods except 91 pass plate 90, rods 85 and 87 also pass plate 88, and rod 85 passes plate 86. In this fashion, the plates can be independently raised and lowered by movement of the rods 85, 87, 89 and 91. As with the brackets and notches shown in FIGS. 11 and 12, a plurality of the lift rod assemblies can be provided at spaced apart locations about the periphery of the plates.

Figure 14:
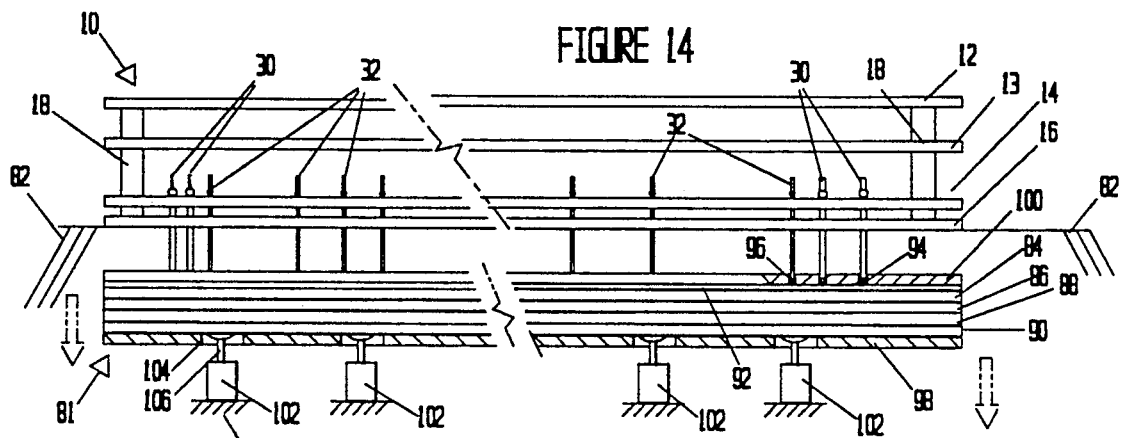
FIG. 14 is an elevational view of the probe cassette located over the probe plates in the probe loading stand, and shows the probes entering the aligned apertures of the uppermost plate of an inverted set of probe plates.

FIG. 14 shows the initial step in transferring the probes 30 and 32 from the probe cassette 10 to the probe plates, generally indicated as 81. This transfer is accomplished in the probe loading machine 56, with the probe plates resting on their respective frames. At the start of the probe transfer step the cassette 10, with blind cover plate 20 removed, is placed on the top of the machine 56, supported by fixed abutments 82 and indexed in vertical alignment with the probe plates by indexing pins (not shown).

The probe plates, which, in this case, comprise four plates 84, 86, 88 and 90 are rested in the probe loading machine, with the lowermost probe plate 90 resting on the loading machine base plate 98 and the remaining three probe plates 88, 86 and 84 resting on the three innermost frames 74, 72 and 70 (see FIG. 11). An on-grid plate 100 is placed on the outermost frame 68. Also included in the assembly of plates is a second shield plate 92 which rests on the uppermost probe plate 84, beneath the on-grid plate 100.

As previously mentioned, each of the frames can be raised and lowered independently of the position and movement of the other frames, as each has an independent drive motor mechanically coupled by a pinion gear which engages a linear rack that is fixedly secured to each frame. Additionally and as shown in FIG. 14, the base plate 98 is provided with vibrator means, which takes the form of a plurality of solenoids 102 that are mounted in receptacles 104 in the base plate 98, with the plungers 106 of the solenoids secured to the base plate 98 and the housings of the solenoids fixedly secured to supporting elements 108 which are carried on the main frame of the probe loading machine 56. The application of 60 cycle ac voltage to the solenoids results in the vibration of the base plate and frames at a frequency proportional to the frequency of the power supply and at an amplitude controlled by the plunger displacement of the solenoids. Two or more rows of solenoids can be provided to impart the necessary shaking of the assembly to urge the pins into the probe heads.

The assembly of probe plates 84–90 and on-grid plate 100, and second shield plate 92 is lowered to the lowermost position of the frames in the machine 56 and the probe cassette is placed over the assembly, resting on the abutments 82 in the manner shown in FIG. 14.

Each of the probe plates 84–90 is drilled with a large hole pattern and a small hole pattern, which correspond to the desired test probe locations; see the pattern 53 of holes shown in FIG. 12. The holes are of lesser diameter than the bulbous enlargements 34 of the probes, which thus function as vertical probe stops in the assembled probe head.

The hole patterns of the four probe plates vary in the following manner. The on-grid plate 100 has hole patterns in which all of the holes are on-grid or are only slightly off-grid, and are thus in substantial alignment with the holes 28 of the probe cassette 10. The uppermost probe plate 84 in the illustrated assembly has holes which are also on grid, in those instances where the test point of the printed circuit happens to fall on-grid, and also has holes which are slightly off-grid. In a preferred application the uppermost plate 84 is drilled with holes which are 15% of the lateral distance between the off-grid test point and the on-grid holes for each off-grid probe. The corresponding holes in the remaining probe plates are successively 25%, 50% and 100% of this distance.

The probe cassette 10 is placed with its lowermost plate 14 opposite the on-grid plate 100. The shield plate 20 (see FIG. 2) is removed from the probe cassette, permitting the probes 30 and 32 to fall into the holes 94 and 96 in the uppermost probe plate 84. The probes are restrained from further movement by the second shield plate 92 and thus rest in the positions shown in FIG. 14.

Figure 15:
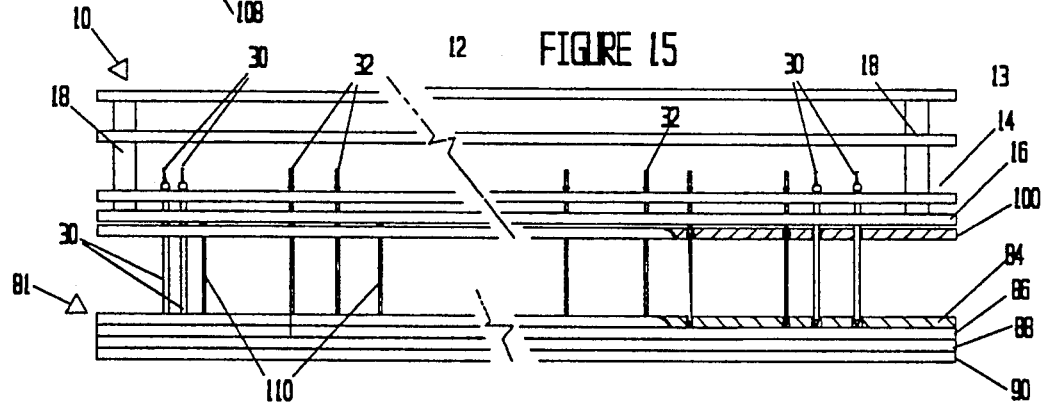
FIG. 15 illustrates a sequential step in the loading of the probes into the probe fixture.

As shown in FIG. 15, the on-grid plate 100 is then raised to its maximum height in the machine 56 to a position immediately beneath the probe cassette 10. The second shield plate 92 is removed from the probe cassette, releasing the probes which fall into the aligned apertures in the uppermost probe plate 84, as shown in FIG. 15. In those instances in which the probe is entirely on-grid, the probes such as 110, and all the large diameter interface probes 30 fall entirely into the stacked probe plates. The off-grid holes which are drilled in the uppermost probe plate 84 are still located very close to on grid points, thereby permitting the probes 32 to fall into all the holes of the uppermost plate 84.

Figure 16:
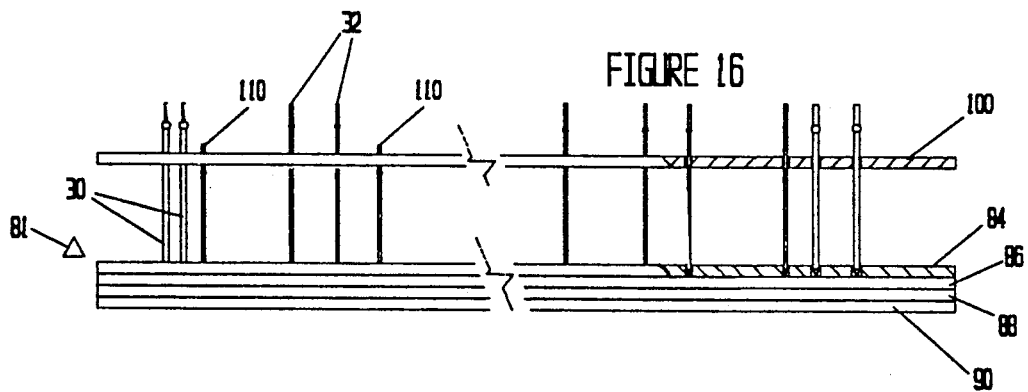
FIG. 16 illustrates a successive step in loading of the probes in which the probe cassette emptied of the probes has been removed from the assembly.
Figure 17:
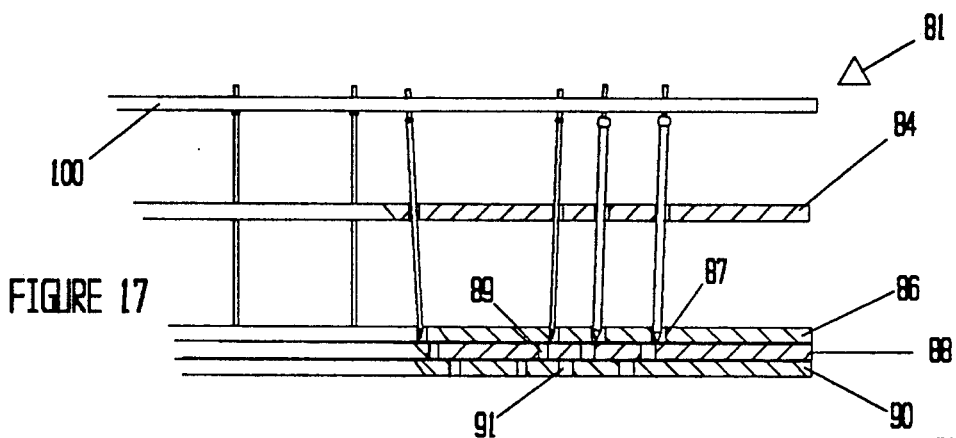
FIG. 17 illustrates a successive step in loading of the probes in which the probe plates are successively raised incrementally to urge the pins in to the canted or tilted positions.

The probe cassette 10 is then removed, resulting in the arrangement shown in FIG. 16. Each of the probe plates 84, 86 and 88 are then raised in separate steps. In the first step, probe plate 84 is raised to the position shown in FIG. 17, causing the probes to tilt slightly so that the lower ends of the probes become aligned with the holes 87 of probe plate 86, which are off-grid by 25% of the final lateral or offset spacing for the probe. The on-grid plate 100 and the probe plate 84 are then dropped 0.1 to 0.15 inch by retraction of their supporting frames a slight distance to insure that the lower ends of the off-grid probes enter the respective holes 87 in the probe plate 86. During this step, the solenoids 102 (see FIG. 14) are actuated to vibrate the entire assembly and urge the probes to enter the holes 87 of the probe plate 86.

Figure 18:
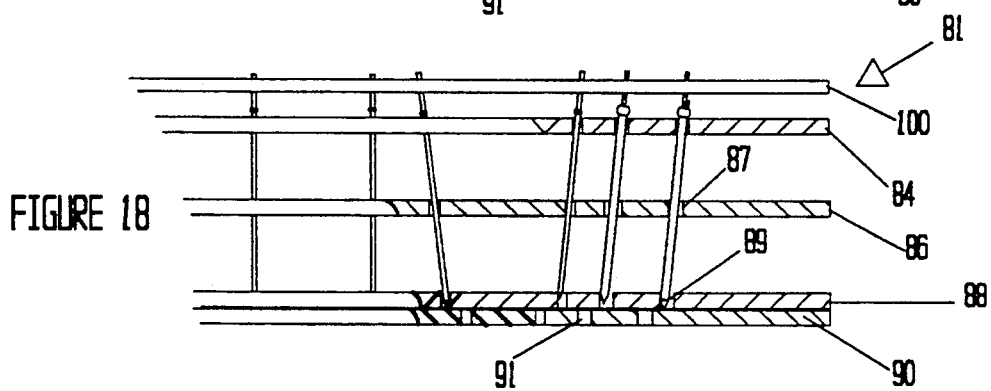
FIG. 18 illustrates the next successive step in loading of the probes.

In the next step, shown in FIG. 18, the on-grid plate 100 and probe plate 84 are raised to their previous positions, and then the probe plates 84 and 86 are raised together, resulting in further canting of the probes until their ends aligned with the off-grid holes 89 of probe plate 88. The on-grid plate 100 and probe plates 84 and 86 are then dropped approximately 0.1–0.15 inch by retraction of their supporting frames to insure that the lower ends of the off-grid probes enter the respective holes 89 in the probe plate 88.

Figure 19:
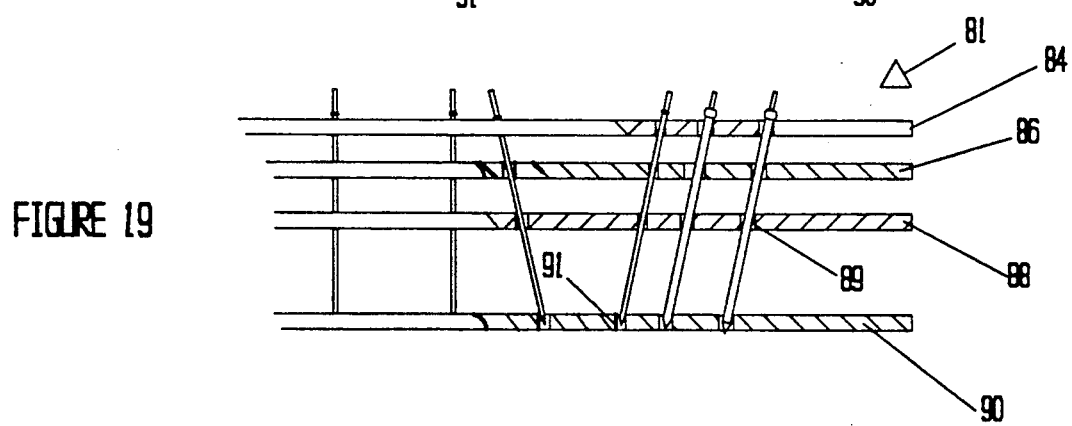
FIG. 19 illustrates the probe plates at their final positions, suitable for removal from the loading stand and the permanent attachment of spacers.

In the next step, the on-grid plate 100 and probe plates 84 and 86 are raised to their previous positions, and then the probe plates 84, 86 and 88 are raised together, resulting in further canting of the probes until their ends aligned with the off-grid holes 91 of probe plate 90. The on-grid plate 100 and probe plates 84–88 are then dropped approximately 0.1–0.15 inch by retraction of their supporting frames to insure that the lower ends of the off-grid probes enter the respective holes 91 in the probe plate 90, and with the assembly reaching the configuration shown in FIG. 19.

Figure 20:
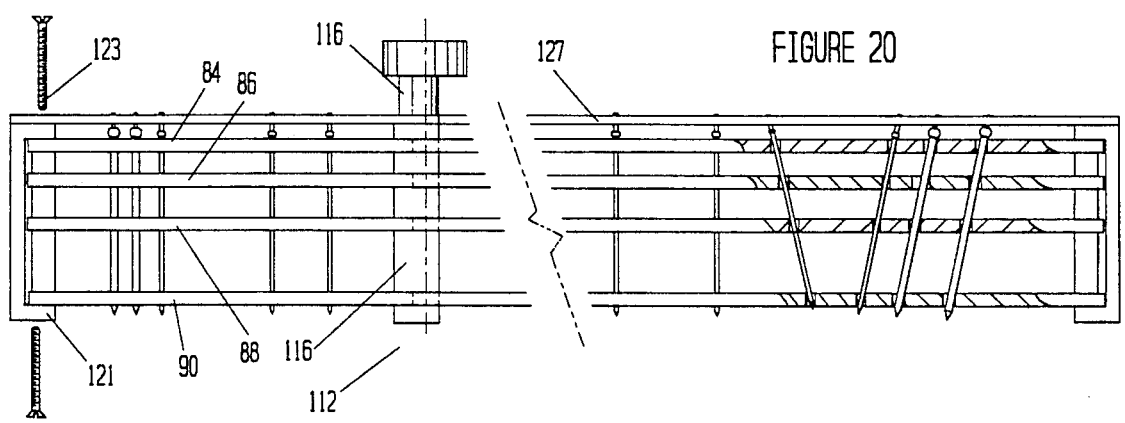
FIG. 20 illustrates temporary plate spacers retaining the assembly of the probe plates, and a cover plate retaining the probes during handling.

Finally, the probe plates 84, 86 and 88 are simultaneously raised, but at incrementally variable rates, so that they simultaneously move into their final positions shown in FIG. 20. As each plate moves through a different distance than the other plates, each plate is moved at its own velocity which is directly proportional to the distance through which it must move to reach its final position.

Once the plates have reached their final positions, the loading machine is stopped, and the probe plate and probe assembly is ready to be unloaded from the machine 56 and secured in its final assembly. As shown in FIG. 20, a cover plate 127 is placed over the tails of the probes 30 and 32. Plate 127 is drilled with holes on grid for each of the probes which are in the probe head assembly. Preferably, the cover plate 127 is a universal cover plate which can be used with any probe head, and for this purpose, it is drilled with a complete on-grid pattern of holes. As the tails of the large diameter probes 30 are of reduced diameter (see FIG. 3), which is less than the diameter of the bulbous enlargement 34 of the small diameter probes 32, the holes in cover plate 127 will accept the tails of all the probes 30 and 32, but will not permit the bulbous enlargements 34 of these probes to pass, thereby capturing the probes in the probe head assembly.

The probe head assembly of the probes and the probe plates is then ready to be removed from the probe loading machine 56.

Figure 21:
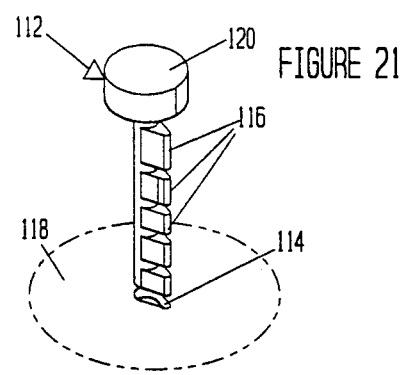
FIG. 21 illustrates the temporary plate spacers.

In the illustrated embodiment, the probe plates are entirely surrounded by frames 68, 70, 72 and 74 (shown in FIG. 11). As shown in FIGS. 20 and 21, temporary retainers 112 are inserted into aligned apertures of the probe plates 84–90. As shown in FIG. 21, the retainers 112 have a knob 120 for grasping, and have a plurality of cams 116 spaced along their length. The retainers 112 are inserted into elongated slotted apertures 114 in the plates, such as plate 118, shown in phantom lines, and are rotated into a position in which the cams are out of alignment with the slot of the aperture 114. This temporarily interlocks the probe plates so that the entire assembly can be removed and carried to a workbench, where permanent retainers can be inserted, usually at the four corners of the assembly.

A plurality of assembly brackets 121 and spacers 125 are used. The spacers 125 are placed between the probe plates 84, 86, 88 and 90, and brackets 121 are placed over the edges of the probe plates 84 and 90. Assembly screws 123 are inserted, through aligned apertures in the cover plate 127, bracket 121 and probe plates, into engagement in threaded bores in the spacers 125. A similar assembly screw is inserted through an apertures in the lower end of bracket 121 and probe plate 90 into a threaded bore in spacer 125.

After the probe head has been used in testing of a printed circuit board, and is to be dismantled, the aforementioned process is reversed, resulting in transferring of the probes from the probe head to the probe cassette 10. The probe cassette is then carried to the probe storage and dispensing unit 40 and the probes are unloaded from the probe cassette into the unit 40, using the reverse of the steps described with reference to FIGS. 14-19. This unloading of the cassette restores the storage and dispensing cassette unit 40 to a fully loaded condition, ready to dispense probes to another probe cassette at whatever probe pattern is required.

The invention provides maximum capability for automatic loading of probes into probe heads at extremely close probe-to-probe spacings and at significant probe inclines. A probe head for virtually any printed circuit can be automatically loaded with the method and apparatus of the invention, including circuits having high population densities of surface mounted components.

The invention has been described with reference to the illustrated and presently preferred embodiment. It is not intended that the invention be unduly limited by this disclosure of the presently preferred embodiment. Instead, it is intended that the invention be defined, by the means, and their obvious equivalents, set forth in the following claims:

What is claimed is:

1. A method for preparation of a probe head useful in automated testing of printed circuit boards and comprising an assembly of probes received in aligned holes of a plurality of spaced apart probe head plates at selected test point positions therein, said method comprising:
    a. storing a multitude of said probes in a probe storage unit at on-grid probe locations in a fully populated grid distribution of said probes at uniform and preselected probe-to-probe spacings;
    b. preparing a selector mask with a plurality of through holes at preselected locations which coincide sufficiently with said on-grid probe locations in said probe storage unit to permit probes at said preselected locations to pass through said mask, and placing said selector mask in a dispensing station against said probe storage unit;
    c. placing a probe cassette beside said mask at said dispensing station and transferring probes at said preselected locations from said dispensing station to said probe cassette; and
    d. transferring said probe cassette to an aligned position against a closely-spaced, stacked array of said probe head plates; and
    e. transferring said probes from said probe cassette to said stacked array of said plates.

2. The method of preparation of a probe head of claim 1 wherein said plurality of through holes are located in said selector mask at preselected locations which coincide sufficiently with said on-grid probe locations in said probe storage unit to permit probes at said preselected locations to pass through said mask.

3. The method for preparation of a probe head of claim 2 wherein said probe storage unit is supported vertically on one edge with said probes resting in substantially horizontal positions and including the steps of assembling said mask and probe cassette against a selected vertical side of said probe storage unit and thereafter pivoting the resulting assembly to a position with said cassette and selector mask beneath said storage unit and with said probes in substantially vertical positions, thereby transferring probes at said preselected locations from said dispensing station to said probe cassette.

4. The method of claim 1 wherein said probe head has probes of large and small diameters and including the steps of providing a first selector mask with a field pattern of holes of small diameters at preselected locations and transferring probes of small diameters from a storage unit into said cassette, and providing a second selector mask with a field pattern of holes of large diameters at preselected location and transferring probes of large diameters into said cassette.

5. The method for preparation of a probe head of claim 4 wherein said probe storage unit is supported vertically on one edge with said small diameter probes resting in substantially horizontal positions on one side of said storage unit, and with said large diameter probes resting in substantially horizontal positions of the other side of said storage unit, and including the steps of assembling said first mask and probe cassette against the vertical side of said probe storage unit in which said small diameter probes are stored and thereafter pivoting the resulting assembly to a position with said cassette and first selector mask beneath said storage unit and with said probes in substantially vertical positions, thereby transferring small diameter probes at said preselected locations from said dispensing station to said probe cassette, returning said probe storage unit to a vertical position, and repeating said steps of assembling said mask and cassette and pivoting of said assembly using said second selector mask to transfer selected large diameter probes to said cassette.

6. A method for preparation of a probe head useful in automated testing of printed circuit boards and comprising an assembly of probes received in aligned holes of a plurality of at least three probe head plates which are supported in a spaced apart array with each of said holes being in a straight line alignment with respective holes in the adjacent head plates which comprises:
    a. stacking closely together a plurality of at least three probe head plates into a stacked array, each of said plates being drilled with a respective field pattern of probe holes, with the field pattern of the holes in the lowermost plate of said stacked array being at positions selected to correspond to test point positions of a printed circuit board, including holes which are out of vertical alignment with respective holes in the uppermost plate, and the field patterns of the other plates of said stacked array including respective holes at locations intermediate their respective holes in said uppermost and lowermost plates such that upon movement of said plates from said stacked array to said spaced apart array, respective probes move into said straight-line alignment; and
    b. positioning test probes into holes in the uppermost plate of said closely stacked head plates with the lower ends of said probes also received in the holes of the next subjacent plate;
    c. moving said uppermost plate and next subjacent plate into preselected and vertically spaced apart positions above the remainder of said plates, thereby tilting probes and causing the lower ends of said tilted probes to enter the holes of the next subjacent plate of said array of stacked plates.

7. The method of claim 6 including the step of providing an on-grid plate having a plurality of holes located in afield pattern of holes all drilled at locations corresponding to locations which are uniformly spaced apart at equal distances in a fully populated grid distribution, and including the steps of positioning said on-grid plate over the uppermost of said stacked probe plates, and raising said on-grid plate to a position immediately beneath the lowermost plate of said probe cassette, while permitting said probes to pass through the holes in said on-grid plate and into the holes of the uppermost plate of said closely stacked head plates.

8. The method for preparation of a probe head of claim 6 further comprising:
raising all said probe head plates at incrementally varied rates to maintain the respective holes of said raised plates in said straight line alignment until said head plates are in their final spaced apart array, and said probes are in final, preselected and inclined positions between said probe head plates.

9. The method for preparation of a probe head of claim 8 further comprising:
fixedly securing said probe plates in said spaced apart array with said probes received in the aligned holes of said probe plates.

10. The method for preparation of a probe head of claim 6 wherein:
said intermediate locations of probe holes are at points which depart from a uniform grid probe-to-probe spacing with the distance of lateral displacement of said holes varied at a predetermined magnitude from plate to plate so as to result in straight line alignments of respective holes which are inclined from orthogonal positions relative to said plates.

11. The method for preparation of a probe head of claim 10 further comprising:
a. placing a cassette containing said probes which are located at preselected locations, over said closely stacked array of probe head plates; and
c. placing the ends of said probes into the holes of the uppermost of said probe head plates.

12. The method for preparation of a probe head of claim 11 further comprising:
vibrating said stacked array of probe plates during the step of transferring said probes to said plates.

13. The method for preparation of a probe head of claim 11 further comprising:
placing a blind plate in said cassette to retain said probes in said cassette during the handling thereof; and
removing said blind plate after said cassette is placed over said closely stacked head plates.

14. The method for preparation of a probe head of claim 11 wherein;
d. said probe head plates are closely stacked in a vertical array, said cassette is superimposed over said stacked array, and said probes are transferred by permitting them to fall into the holes of said first probe plate.

15. The method for preparation of a probe head of claim 14 further comprising:
raising the uppermost plate of said stacked array of head probe plates to a position spaced above the subjacent head plate to permit said probes to pass through the holes of said uppermost probe plate, thereby deflecting the lower ends of said probes towards and into the respective holes of the next subjacent probe head plate.

* * * * *